(12) United States Patent
Ogawa et al.

(10) Patent No.: US 6,841,740 B2
(45) Date of Patent: Jan. 11, 2005

(54) PRINTED-WIRING SUBSTRATE AND METHOD FOR FABRICATING THE SAME

(75) Inventors: Kouki Ogawa, Aichi (JP); Eiji Kodera, Aichi (JP)

(73) Assignee: NGK Spark Plug Co., Ltd., Aichi (JP)

(*) Notice: Subject to any disclaimer, the term of this patent is extended or adjusted under 35 U.S.C. 154(b) by 274 days.

(21) Appl. No.: 09/836,285

(22) Filed: Apr. 18, 2001

(65) Prior Publication Data

US 2002/0011351 A1 Jan. 31, 2002

(30) Foreign Application Priority Data

Jun. 14, 2000  (JP) ........................................ 2000-178491

(51) Int. Cl.$^7$ ........................... H05K 1/03; H05K 1/09
(52) U.S. Cl. ..................... 174/256; 174/255; 361/766; 361/763
(58) Field of Search .................... 361/760–766, 361/795, 523, 528, 777–782; 174/255–262; 438/638–639, 694; 257/787–796

(56) References Cited

U.S. PATENT DOCUMENTS

| | | | |
|---|---|---|---|
| 5,161,093 A | * 11/1992 | Gorczyca et al. | ........... 361/795 |
| 5,248,852 A | 9/1993 | Kumagai | |
| 5,866,952 A | 2/1999 | Wojnarowski et al. | |
| 6,002,592 A | * 12/1999 | Nakamura et al. | .......... 361/760 |
| 6,153,290 A | * 11/2000 | Sunahara | ................ 428/210 |

FOREIGN PATENT DOCUMENTS

| | | |
|---|---|---|
| EP | 0 901 316 A2 | 3/1999 |
| JP | 4-208453 | 7/1992 |
| JP | 5-299788 | 11/1993 |
| JP | 6-21593 | 1/1994 |
| JP | 6-326472 | 11/1994 |
| JP | 7-263619 | 10/1995 |
| JP | 8-255870 | 10/1996 |
| JP | 2598706 | 1/1997 |
| JP | 11-87918 | 3/1999 |

* cited by examiner

Primary Examiner—John B. Vigushin
Assistant Examiner—Tuan Dinh
(74) Attorney, Agent, or Firm—Sughrue Mion, PLLC

(57) ABSTRACT

A printed-wiring substrate including a capacitor element, as well as a method for fabricating the printed-wiring substrate. An insulating substrate 3 is molded by placing a capacitor element 13 in a mold and charging a resin 4 into the mold. Therefore, the capacitor element 13 having a size (i.e., electrostatic capacitance) sufficient to suppress switching noise of an IC chip 15 and stabilize operation power voltage can be disposed, while providing a dimensional margin. Since the possibility of failing to embed the capacitor element 13 decreases, the printed-wiring substrate can be fabricated at reduced cost.

10 Claims, 4 Drawing Sheets

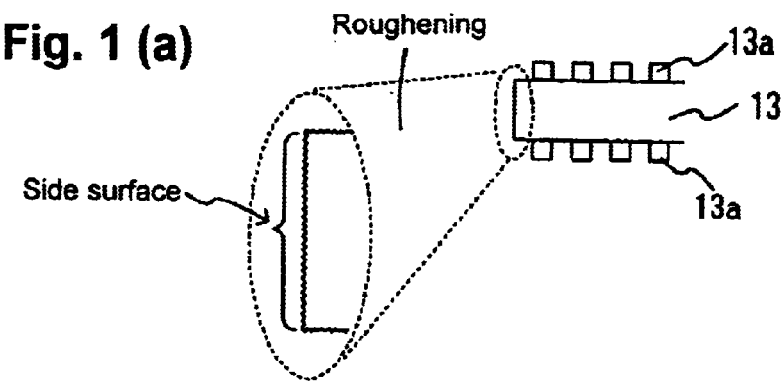
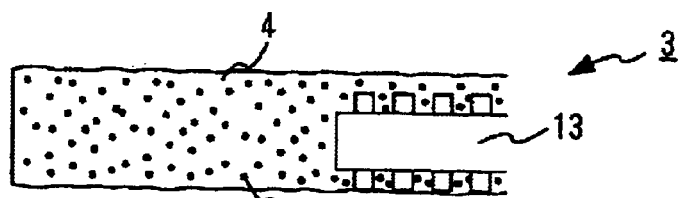
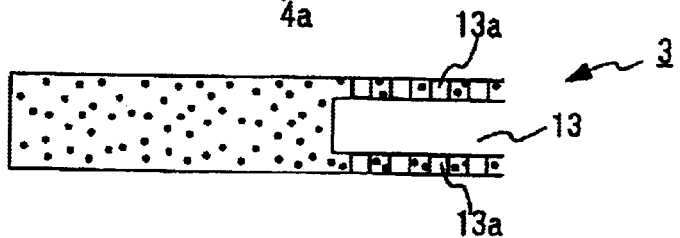
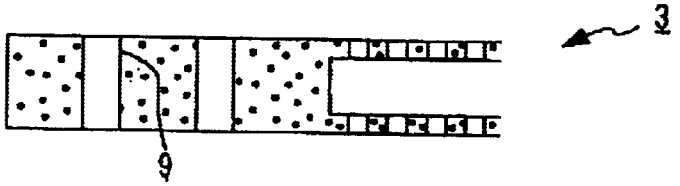
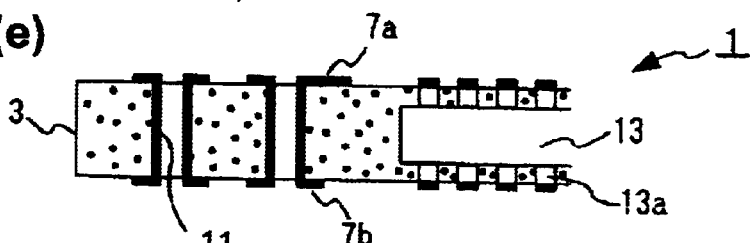
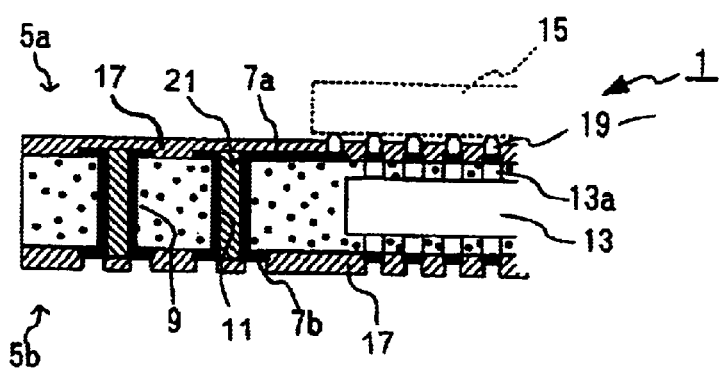

PRINTED-WIRING SUBSTRATE AND METHOD FOR FABRICATING THE SAME

BACKGROUND OF THE INVENTION

1. Field of the Invention

The present invention relates to a printed-wiring substrate on which an integrated-circuit element is mounted, and to a method for fabricating the printed-wiring substrate.

2. Description of the Related Art

Conventionally, in a printed-wiring substrate on which an integrated-circuit element (hereinafter referred to as an "IC chip") is mounted, a capacitor element is provided in order to reduce switching noise of the IC chip and stabilize operation power voltage. However, when the length of wiring between the IC chip and the capacitor element provided on the printed-wiring substrate increases, the inductance of the wiring increases, so that it becomes difficult to attain the above-described object to a sufficient extent. Therefore, the capacitor element is desirably provided in the vicinity of the IC chip.

In view of the foregoing, conventionally, techniques disclosed, for example, in Japanese Patent Application Laid-Open (kokai) Nos. 7-263619 and 11-67961 have been proposed. In the technique disclosed in Japanese Patent Application Laid-Open No. 7-263619, a concave portion is formed in a base substrate (a substrate constituting the bottom portion of a multilayer printed-wiring substrate), a capacitor element is placed in the concave portion, and other layers are formed over the capacitor element to thereby embed the capacitor element within the printed-wiring substrate. In the technique disclosed in Japanese Patent Application Laid-Open No. 11-67961, a capacitor element is mounted on the surface of a core substrate (a substrate serving as a center substrate of a multilayer printed-wiring substrate), and insulating and conductor layers are stacked thereon by a buildup process to thereby constitute a multilayer printed-wiring containing a capacitor element. When a capacitor element is built into a printed-wiring substrate as described above, the length of wiring between an IC chip and the capacitor element can be shortened as compared with the case in which the capacitor element is mounted on the surface of the printed-wiring substrate. Therefore, these techniques are advantageous in that they reduce switching noise and stabilize operation power voltage.

3. Problems Solved by the Invention

The technique disclosed in Japanese Patent Application Laid-Open No. 7-263619 is preferable, because it enables a capacitor element to be built into a substrate while suppressing an increase in thickness of the substrate. However, since a concave accommodation portion must be formed in the substrate, the number of fabrication steps and the fabrication time increase, with a resultant increase in production cost.

The method disclosed in Japanese Patent Application Laid-Open No. 11-67961 does not require advance formation of a concave portion. In this method, a capacitor element is disposed in an insulating layer stacked on the core substrate. However, stacking an insulating layer by means of a buildup process is not easy, because a capacitor element of a few hundreds of nF which is actually required for achieving the above-described action has a thickness of 500 $\mu$m or greater, whereas the thickness of a typical insulating layer stacked by the buildup process has a thickness of a few tens of $\mu$m. In addition, if embedding of the capacitor element fails, a large number of process steps which had been performed before the capacitor element was built in (e.g., a step of molding the core substrate, and a step of forming conductor patterns) become useless, thereby increasing production cost.

SUMMARY OF THE INVENTION

The present invention has been achieved in order to solve the above-described problems. It is therefore an object of the invention to provide a printed-wiring substrate including a capacitor element which can be fabricated easily at low cost, as well as to provide a method for fabricating the printed-wiring substrate.

The above objectives have been achieved, in a first aspect of the present invention, by providing (1) a printed-wiring substrate which comprises:
an insulating substrate serving as a support;
a conductor layer formed on the insulating substrate; and
a capacitor element embedded in the insulating substrate and connected to the conductor layer, wherein
an integrated-circuit element is mounted on the printed-wiring substrate while being connected to the conductor layer, characterized in that
the insulating substrate is molded by placing the capacitor element in a predetermined mold and charging resin into the mold.

The insulating substrate of the printed-wiring substrate (1) of the present invention is molded by placing the capacitor element in a mold and charging resin into the mold. That is, by prior placement of the capacitor element within a mold for molding the insulating substrate, the capacitor element is embedded in the printed-wiring substrate.

Since the insulating substrate serving as a support of the printed-wiring substrate is thick, a capacitor element having a size (i.e., electrostatic capacitance) sufficient to suppress switching noise of an integrated-circuit element and stabilize operation power voltage can be disposed, while a dimensional margin is provided.

That is, when an insulating substrate is configured as in the case of (1) above, a capacitor element can be embedded more easily, as compared with conventional methods (i.e., a method for forming a concave portion in a previously molded substrate and placing a capacitor element into the concave portion, and a method for embedding a capacitor element between insulating layers stacked by a buildup process. Since the possibility of failing to embed a capacitor element decreases, the printed-wiring substrate can be fabricated at reduced cost.

The step of molding an insulating substrate serving as a support of the printed-wiring substrate is a step close to the beginning of a process of fabricating the printed-wiring substrate. In the case of a printed-wiring substrate having a conventional configuration, when the step of embedding a capacitor element fails, a large number of steps performed before the embedding step are lost, which is a cause of increased production cost. In the case of the printed-wiring substrate (1) of the present invention, even if the step of embedding a capacitor element in the insulating substrate fails, the influence of the failure on the overall fabrication process of the printed-wiring substrate is relatively small, so that the printed-wiring substrate can be fabricated at reduced cost.

When a capacitor element is embedded into the insulating substrate in the above-described manner, the following problem may arise. When an external force acts on the insulating substrate, stresses act on the capacitor element embedded in the insulating substrate, thus adversely affecting the capacitor element (e.g., resulting in deformation, breakage, etc. of the capacitor element) and making it difficult to sufficiently obtain the intended function of reducing switching noise and stabilizing operation power voltage. In addition, it is considered that even when no external force acts on the insulating substrate, stresses act on the capacitor element due to thermal expansion of the insulating substrate itself.

Therefore, as described in a second aspect (2) of the invention, the insulating substrate preferably has a reinforcement member embedded in the insulating substrate. In this case, in addition to the effects achieved by the first aspect of the invention (1), the printed-wiring substrate can achieve an effect such that the dimensional stability (i.e., stability of the substrate dimensions against temperature variation) and rigidity of the insulating substrate can be improved, and the capacitor element embedded in the insulating substrate can be effectively protected.

The increased dimensional stability of the insulating substrate enables the wiring patterns to be formed on the insulating substrate more accurately by the buildup process. The increased rigidity of the insulating substrate enables fabrication of a large number of printed-wiring substrates from a large substrate for multi-piece fabrication. As a result, the number of fabrication steps can be reduced, thus facilitating fabrication of the printed-wiring substrate and further reducing fabrication cost.

The reinforcement member may be formed of a thread made of glass, metal, or resin; woven fabric obtained by weaving the thread; nonwoven fabric of glass, metal, or resin; woven fabric obtained by weaving the thread and impregnated with resin; or nonwoven fabric made of glass, metal, or resin impregnated with resin. Further, a glass plate, a metal plate, a resin plate, or a ceramic plate may be used as the reinforcement member.

That is, as described in a third aspect (3) of the invention, the insulating substrate may be configured such that glass cloth is embedded in the insulating substrate as the reinforcement member. A configuration for embedding glass cloth in the insulating substrate is to dispose sheets of glass cloth within the insulating substrate in such manner that the sheets extend along the substrate surface, as described in the preferred embodiments below.

As described in a fourth aspect (4) of the invention, the insulating substrate may be configured such that a metal plate is embedded in the insulating substrate as the reinforcement member. A configuration for embedding a metal palate in the insulating substrate is to dispose a metal plate within the insulating substrate in such manner that the metal plate extends along the substrate surface, as described in the preferred embodiments below.

When conductor layers (wiring patterns) are provided on the opposite surfaces of the insulating substrate, in some cases, through-hole conductors are formed in the insulating substrate in order to electrically connect the conductor layers on the opposite surfaces. In such a case, in order to prevent electrical contact between the metal plate and the through-hole conductors, through holes of greater cross section than through holes for the through-hole conductors are formed in the metal plate at positions corresponding to those of the through-hole conductors. Moreover, when the metal plate is used as a power source layer or ground layer, the metal plate may be electrically connected to the through-hole conductors. In this case, circular depressions of greater diameter than thorough holes for the through-hole conductors are preferably formed in advance in the metal plates at positions corresponding to those of the through-hole conductors, in order to facilitate formation of the through-hole conductors penetrating the metal plate. The work for forming holes by use of a laser, a drill, or the like can be made easier, because the metal plate has a reduced thickness in the concave portions.

As described in a fifth aspect (5) of the invention, at least side surfaces of the capacitor element are preferably roughened in order to increase the adhesion strength between the capacitor element and resin charged into a mold. The roughened side surfaces increase the bonding strength between the capacitor element and resin used for molding the insulating substrate to thereby increase the rigidity of the insulating substrate. The increased rigidity of the insulating substrate enables fabrication of a large number of printed-wiring substrates from a large substrate for multi-piece fabrication. As a result, fabrication of the printed-wiring substrate is facilitated, and fabrication cost is reduced further.

A sixth aspect (6) of the invention is directed to a method for fabricating a printed-wiring substrate including an insulating substrate formed of resin and serving as a support, a conductor layer formed on the insulating substrate, and a capacitor element connected to the conductor layer, the method being characterized by comprising:

a first step of placing the capacitor element in a mold and charging resin into the mold to thereby mold the insulating substrate;

a second step of exposing terminals of the capacitor element to the outside of the insulating substrate; and a third step of forming a conductor layer on the insulating substrate such that the conductor layer is connected to the terminals of the capacitor element exposed to the outside of the insulating substrate.

As described above, in the method for fabricating a printed-wiring substrate according to the present invention, in the first step, the capacitor element is placed in a mold and resin is charged into the mold to thereby mold the insulating substrate. In the second step subsequent to the first step, terminals of the capacitor element are exposed to the outside of the insulating substrate. Further, in the third step, a conductor layer is formed on the insulating substrate such that the conductor layer is connected to the terminals of the capacitor element exposed to the outside of the insulating substrate.

In the method for fabricating a printed-wiring substrate according to the present invention, since the insulating substrate can be molded by placing the capacitor element in a mold and charging resin into the mold, the capacitor element can be embedded more easily, as compared with the above-described conventional methods. Since the possibility of failing to embed a capacitor element decreases, the printed-wiring substrate can be fabricated at reduced cost.

The step of molding an insulating substrate serving as a support of the printed-wiring substrate is a step close to the beginning of a process of fabricating the printed-wiring substrate. In the case of a printed-wiring substrate having a conventional configuration, when the step of embedding a capacitor element fails, a large number of steps performed before the embedding step are lost, which is a cause of increased production cost. In the case of the method for fabricating a printed-wiring substrate (6) according to the present invention, even when the step of embedding a capacitor element in the insulating substrate fails, the influence of the failure on the overall fabrication process of the printed-wiring substrate is relatively small, so that the printed-wiring substrate can be fabricated at reduced cost.

The capacitor element may be disposed within a mold at a predetermined position (an optimal position which is set in advance in accordance with the size and thickness of the insulating substrate and the size of the capacitor element) with a predetermined posture or orientation (a posture that enables the terminals of the capacitor element to be exposed to the outside of the insulating substrate, by polishing the substrate surface of the insulating substrate, or forming openings in the insulating substrate by means of laser machining).

The fabrication method described in (6) above enables fabrication of the printed-wiring substrate described in (1). When the printed-wiring substrate described in (3) is to be fabricated, the fabrication is performed as described in a seventh aspect (7) of the invention. That is, in the fabrication method described in (7), charging of resin into the mold performed in the first step is divided into a plurality of charging operations, and between subsequent operations of injecting the resin, a sheet of glass cloth is disposed on a resin layer formed within the mold to thereby mold the insulating substrate, which includes layers of the resin and the layer of glass cloth alternately stacked in the thickness direction.

The method for fabricating a printed-wiring substrate described in (7) enables fabrication of an insulating substrate, which includes layers of the resin and the layer of glass cloth alternately stacked in the thickness direction. Therefore, in addition to the effects achieved by the invention described in (6), the fabrication method described in (7) achieves an additional effect such that the dimensional stability (i.e., stability of the substrate dimensions against temperature variation) and rigidity of the insulating substrate can be improved, and the capacitor element embedded in the insulating substrate can be effectively protected.

For example, the fabrication method described in (7) can eliminate the drawback such that when stresses act on the capacitor element embedded in the insulating substrate due to an external force acting on the insulating substrate or thermal expansion of the insulating substrate itself, the stresses adversely affect the capacitor element (e.g., result in deformation, breakage, etc. of the capacitor element) and make it difficult to sufficiently obtain the intended function of reducing switching noise and stabilizing operation power voltage.

The increased dimensional stability of the insulating substrate enables the wiring patterns to be formed on the insulating substrate more accurately by the buildup process. The increased rigidity of the insulating substrate enables fabrication of a large number of printed-wiring substrates from a large substrate for multi-piece fabrication. As a result, the number of fabrication steps can be reduced, thereby facilitating fabrication of the printed-wiring substrate and further reducing fabrication cost.

When the printed-wiring substrate described in (4) is to be fabricated, the fabrication is performed as described in an eighth aspect (8) of the invention. That is, in the fabrication method described in (8), charging of resin into the mold performed in the first step is divided into a plurality of charging operations, and between subsequent operations of injecting the resin, a metal plate is disposed on a resin layer formed within the mold to thereby mold the insulating substrate, which includes layers of the resin and the metal plate alternately stacked in the thickness direction.

The method for fabricating a printed-wiring substrate described in (8) enables fabrication of an insulating substrate, which includes layers of the resin and the metal plate alternately stacked in the thickness direction. Therefore, the fabrication method described in (8) achieves effects similar to those achieved by the fabrication method described in (7).

When conductor layers (wiring patterns) are provided on the opposite surfaces of the insulating substrate, in some cases, through-hole conductors are formed in the insulating substrate in order to electrically connect the conductor layers on the opposite surfaces. In such a case, in order to prevent electrical contact between the metal plate and the through-hole conductors, a step of forming through holes of greater cross section than through holes for the through-hole conductors in the metal plate at positions corresponding to those of the through-hole conductors is performed before the first step.

When the printed-wiring substrate described in (5) is to be fabricated, the fabrication is performed as described in a ninth aspect (9) of the invention. That is, in the fabrication method described in (9), a step of roughening at least side surfaces of the capacitor element is performed before the first step.

According to the fabrication method described in (9), at least side surfaces of the capacitor element are roughened in order to increase the adhesion strength between the capacitor element and resin charged into a mold. The roughened side surfaces increase the bonding strength between the capacitor element and resin used for molding the insulating substrate to thereby increase the rigidity of the insulating substrate. The increased rigidity of the insulating substrate enables fabrication of a large number of printed-wiring substrates from a large substrate for multi-piece fabrication. As a result, the number of fabrication steps can be reduced, thus facilitating fabrication of the printed-wiring substrate and further reducing fabrication cost.

BRIEF DESCRIPTION OF THE DRAWINGS

FIG. 1 is an explanatory view showing the structure of the printed-wiring substrate according to a first embodiment of the invention and a method for fabricating the same, including sequential views 1(b) to 1(f). FIG. 1(a) shows roughening of a side surface prior to embedding the capacitor.

Description of Reference Numerals

Figure 2:
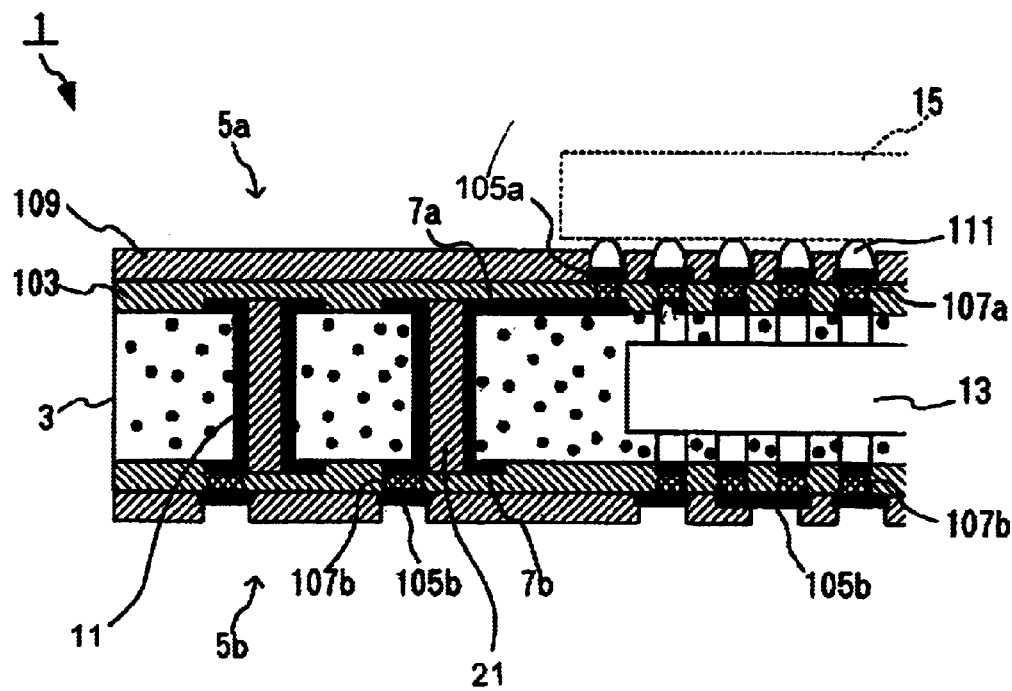
FIG. 2 is an explanatory view showing the structure of the printed-wiring substrate according to a second embodiment of the invention.

| | |
|---|---|
| 1 | printed-wiring substrate |
| 3 | insulating substrate |
| 4 | resin |
| 9 | through hole |
| 11 | through-hole conductor |
| 7a, 7b | wiring pattern |
| 13, 413 | capacitor element |
| 13a, 413a | terminals of capacitor element |
| 15 | IC chip |
| 105a, 105b | second wiring pattern |
| 203 | glass cloth |
| 303 | metal plate |
| 430 | fiber |

DETAILED DESCRIPTION OF THE PREFERRED EMBODIMENTS

An embodiment of the present invention will next be described with reference to the drawings. However, the present invention should not be construed as being limited thereto.

FIG. 1 is an explanatory view showing the structure of a printed-wiring substrate 1 according to a first embodiment and the steps of fabricating the same. As shown in FIG. 1(f), in the printed-wiring substrate 1, wiring patterns 7a and 7b made of Cu are formed on front and back surfaces (a first surface 5a and a second surface 5b), respectively, of an insulating substrate 3 made of resin and having a thickness of about 1 mm. The insulating substrate 3 serves as a support of the printed-wiring substrate 1. The wiring patterns 7a and 7b correspond to the "conductor layer".

Through holes 9 are formed in the insulating substrate 3 in such a manner that the through holes 9 penetrate the insulating substrate 3 from one surface to the other surface thereof; and a through-hole conductor 11 is formed on the wall surface of each through hole 9. The wiring pattern 7a on the first surface 5a and the wiring pattern 7b on the second surface 5b are connected to each other by means of the through-hole conductor 11. The interior of each through-hole conductor 11 is filled with resin 21.

Further, a capacitor element 13 is disposed within the insulating substrate 3. The capacitor element 13 suppresses switching noise generated by an IC chip 15 which is to be mounted on the printed-wiring substrate 1 and stabilizes operation power voltage supplied to the IC chip 15. Terminals 13a of the capacitor element 13 are connected to the wiring patterns 7a and 7b formed on the opposite surfaces of the insulating substrate 3.

The wiring patterns 7a and 7b are covered with a solder resist layer 17, except for predetermined portions to be exposed (portions where components such as the IC chip 15 are connected to the wiring patterns 7a and 7b). Bumps 19 for establishing connection with the IC chip 15 are formed on some exposed portions to be connected to the IC chip 15. Although the present embodiment will be described with reference to an example in which only one capacitor element 13 is embedded in the insulating substrate 3, a plurality of capacitor elements 13 may be embedded in the insulating substrate 3.

Next, a method for fabricating the printed-wiring substrate will be described with reference to FIG. 1.

First, surfaces of a capacitor element 13, including side surfaces thereof, are roughened (FIG. 1(a)). In the present embodiment, the surface roughening for the capacitor element 13 is performed by means of barrel polishing. However, polishing by use of a belt sander, sand blasting, buffing, or any other suitable polishing method may be employed. This polishing process corresponds to the "step of roughening at least side surfaces of the capacitor element before the first step".

Subsequently, the capacitor element 13 having roughened surfaces is placed in a mold for molding an insulating substrate 3 (which corresponds to the "mold"). Subsequently, resin 4 is charged into the mold and is hardened (FIG. 1(b)). In order to harden the resin 4, any of various methods may be employed, depending on the type of the resin 4. In the present embodiment, the resin is hardened (cured) through application of heat and subsequently drying. This hardening process corresponds to the "first step".

The resin 4 used for molding the insulating substrate 3 preferably contains a filler 4a (e.g., $SiO_2$) having a coefficient of thermal expansion lower than that of the resin 4. This enables accurate control of the coefficient of thermal expansion of the insulating substrate 3, which is a composite member of the resin 4 and the filler 4a. Consequently, the coefficient of thermal expansion of the insulating substrate 3 can be easily matched with those of the wiring patterns made of, for example, Cu and the IC chip 15 made of, for example, Si. Therefore, the reliability against heating of an electronic circuit to be fabricated on the insulating substrate 3 (i.e., on the printed-wiring substrate 1) can be improved.

After molding of the insulating substrate 3 from the resin 4, the opposite surfaces of the insulating substrate 3 are polished in order to flatten the opposite surfaces and expose the terminals 13a of the capacitor element 13 to the outside from at least one surface (both surfaces in the present embodiment) of the insulating substrate 3 (FIG. 1(c)). This process corresponds to the "second step".

Subsequently, through holes 9 are formed by means of a drill (FIG. 1(d)).

Subsequently, the wall surfaces of the through holes 9 are plated in order to form through-hole conductors 11; and wiring patterns 7a and 7b are formed on the opposite surfaces of the insulating substrate 3 by means of a subtractive process (FIG. 1(e)). This process corresponds to the "third step". The wiring patterns 7a and 7b are formed in such a manner that portions of wiring patterns 7a and 7b are electrically connected to the terminals 13a of the capacitor element 13. Further, portions of the wiring patterns 7a and 7b provided on the opposite surfaces of the insulating substrate 3 are electrically connected with each other by means of the through-hole conductors 11. The interiors of the through holes 9 are filled with resin 21.

After forming the wiring patterns 7a and 7b, a solder resist layer 17 is formed on the opposite surfaces of the insulating substrate 3. At this time, through exposure and development processes, openings are formed in the solder resist layer 17 in order to expose portions of the wiring patterns 7a and 7b to which portions components such as an IC chip 15 one connected. Subsequently, bumps 19 for establishing connection with the IC chip 15 are formed on some of the exposed portions to which the IC chip 15 is to be connected (in the present embodiment, the exposed portions of the wiring pattern 7a on the first surface 5a side). Notably, the bumps 19 are formed on the wiring pattern 7a after forming a Ni/Au plating layer (not shown) on the wiring pattern 7a (FIG. 1(f)).

The above-described first embodiment achieves the following effects (1) to (3).

(1) Since the insulating substrate 3 is molded such that the resin 4 for molding the substrate is charged into a mold after placing the capacitor element 13 within the mold, the capacitor element 13 having a size (i.e., electrostatic capacitance) sufficient to provide a function of suppressing switching noise of the IC chip 15 and stabilizing operation power voltage can be embedded in the printed-wiring substrate 1 more easily as compared with prior-art techniques, while a dimensional margin can be provided. Since the possibility of failing to embed the capacitor element 13 decreases, the printed-wiring substrate can be fabricated at reduced cost.

(2) The step for forming the insulating substrate 3 serving as a support of the printed-wiring substrate 1 (FIG. 1(b)) is a step relatively close to the beginning of the process of fabricating the printed-wiring substrate 1. Therefore, even when the embedding of the capacitor element 13 into the insulating substrate 3 fails, the influence of the failure on the overall fabrication process of the printed-wiring substrate 1 is relatively small. In addition, the printed-wiring substrate 1 can be fabricated at reduced cost.

(3) Since the surface of the capacitor element 13 is roughened (FIG. 1(a)) to thereby increase adhesion strength between the capacitor element 13 and the resin charged into the mold, the rigidity of the insulating substrate can be improved by increasing the bonding strength between the capacitor element and the resin for molding the insulating substrate. This enables a large number of printed-wiring substrates to be fabricated from a large substrate for multi-piece fabrication. As a result, the fabrication of the printed-wiring substrate is facilitated, and the production cost can be reduced further.

Next, a second embodiment of the present invention will be described. FIG. 2 is an explanatory view showing the structure of a printed-wiring substrate 1 according to the second embodiment. In contrast with the printed-wiring substrate 1 of the first embodiment in which a single conductor layer (wiring pattern 7a, 7b) is provided on either surface of the insulating substrate 3, in the printed-wiring substrate 1 of the second embodiment, another conductor layer (second wiring pattern 105a, 105b) of Cu and an insulating layer 103 are further stacked on either surface of the insulating substrate 3 (i.e., the printed-wiring substrate 1 of the second embodiment is a multilayer printed-wiring substrate).

Specifically, the insulating layer 103 is formed on each of the wiring patterns 7a and 7b. The second wiring pattern 105a is formed on the corresponding insulating layer 103 stacked on the wiring pattern 7a, which is formed on the first surface 5a; and the second wiring pattern 105b is formed on the corresponding insulating layer 103 stacked on the wiring pattern 7b, which is formed on the second surface 5b. The wiring pattern 7a (7b) and the second wiring pattern 105a (105b) are connected to each other by means of vias 107a (107b). Notably, the interiors of the through-hole conductors 11 are filled with insulating resin.

The second wiring patterns 105a and 105b are covered with a solder resist layer 109, except for predetermined portions to be exposed (portions where components such as the IC chip 15 are connected to the second wiring patterns 105a and 105b). Bumps 111 for establishing connection with the IC chip 15 are formed on some exposed portions to be connected to the IC chip 15.

The printed-wiring substrate 1 of the second embodiment is fabricated by a method which follows the steps of the method employed for the first embodiment shown in FIGS. 1(a) to 1(e), up to the step of forming the wiring patterns 7a and 7b on the opposite surfaces of the insulating substrate 3. Therefore, repeated descriptions of these steps are omitted.

In the fabrication of the printed-wiring substrate 1 of the second embodiment, after the step that has been described with reference to FIG. 1(e), as shown in FIG. 2, an insulating layer 103 is formed on each of the opposite surfaces of the insulating substrate 3, after which vias 107a and 107b and conductor layers (second wiring patterns 105a and 105b) are formed.

After the second wiring patterns 105a and 105b are formed in the above-described manner, a solder resist layer 109 is stacked. At this time, through exposure and development processes, openings are formed in the solder resist layer 109 in order to expose portions of the second wiring patterns 105a and 105b to which portions components such as an IC chip 15 must be connected. Subsequently, bumps 111 for establishing connection with the IC chip 15 are formed on some of the exposed portions to which the IC chip 15 is to be connected (in the present embodiment, the exposed portions of the second wiring pattern 105a on the first surface 5a side). Notably, the bumps 111 are formed on the second wiring pattern 105a after formation of an Ni/Au plating layer (not shown) on the second wiring pattern 105a.

The above-described second embodiment achieves the same effects as the above-described effects (1) to (3). Similar effects can be obtained in cases in which the number of layers is increased further.

Next, a third embodiment will be described. In the third embodiment, layers of resin 4 and layers of glass cloth 203 are stacked in the thickness direction in order to constitute the insulating substrate 3. Specifically, in the step having been described with reference to FIG. 1(b) (i.e., the "first step"), charging of the resin 4 into a mold is divided into a plurality of charging operations (three operations in the third embodiment); and between subsequent operations of charging the resin 4, a sheet of glass cloth 203 is disposed on the layer of the resin 4 formed in the mold. Thus is formed the insulating substrate 3, which includes layers of the resin 4 and the layers of glass cloth 203 alternately stacked in the thickness direction.

Figure 3:
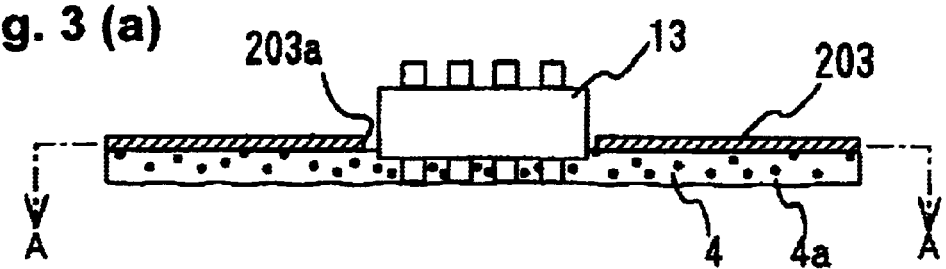
FIGS. 3(a) to 3(c) are explanatory views showing the structure of the printed-wiring substrate according to a third embodiment of the invention and a method for fabricating the same.
Figure 3:
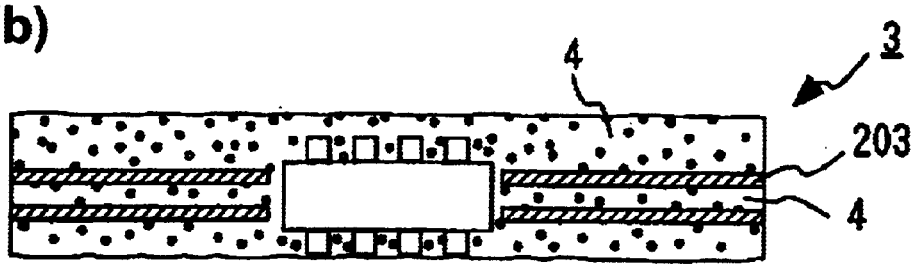
Figure 3:
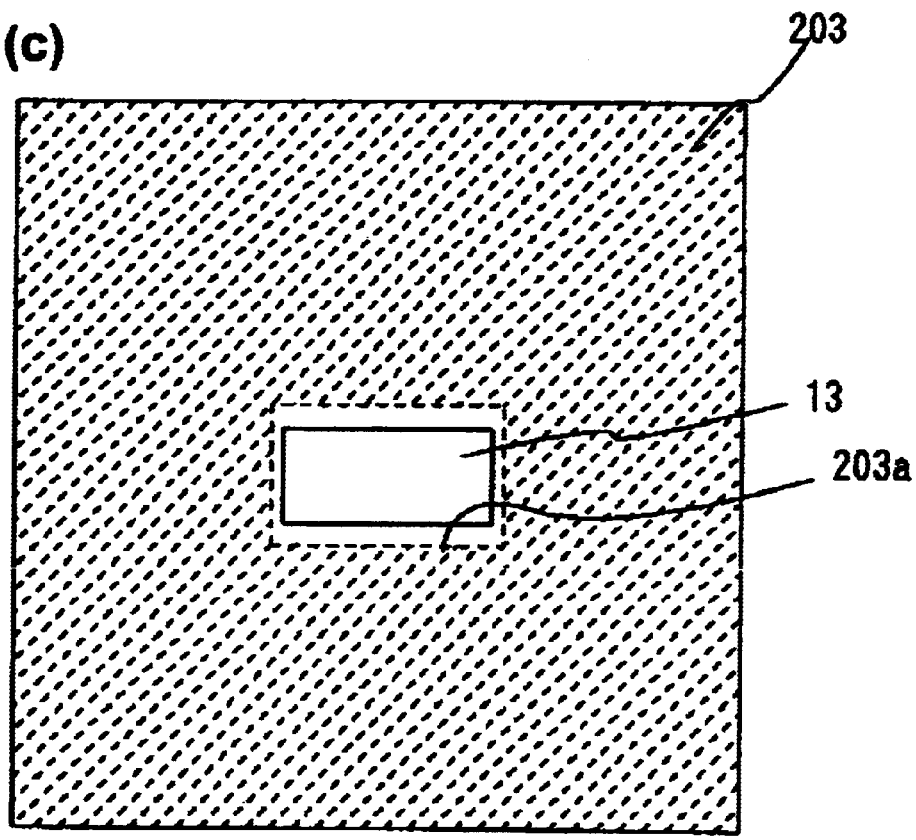

This step will be described in detail. As shown in FIG. 3(a), a capacitor element 13 having a roughened surface is placed in an unillustrated mold for molding the insulating substrate 3. Into the mold, a predetermined amount (about ⅓ the amount necessary to mold the insulating substrate 3) of resin 4 is charged. The charging of the resin 4 is stopped temporarily, and a sheet of glass cloth 203 is placed on the charged resin 4. As shown in FIG. 3(c), which is a cross section taken along line A—A in FIG. 3(a), the sheet of glass cloth 203 has a size which is substantially the same as that of the insulating substrate 3 to be molded; and a through hole 203a having a cross section greater than that of the capacitor element 13 is formed in the sheet of glass cloth 203 at a position corresponding to that of the capacitor element 13.

Subsequently, charging of the resin 4 in a predetermined amount and disposition of the sheet of glass cloth 203 are performed sequentially; and finally, the resin 4 is charged in a predetermined amount. Subsequently, the resin 4 is hardened to thereby obtain the insulating substrate 3, which includes layers of the resin 4 and the layers of glass cloth 203 alternately stacked in the thickness direction (FIG. 3(b)).

Since the structure and the fabrication steps of the printed-wiring substrate according to the third embodiment are the same as those of the second embodiment, repeated descriptions thereof are omitted.

In addition to the above-described effects (1) to (3), the printed-wiring substrate according to the third embodiment achieves the following effects (4) to (7).

(4) Since the insulating substrate 3 is formed through alternate stacking of the resin 4 and the glass cloth 203 in the thickness direction thereof, the dimensional stability (i.e., stability of the substrate dimensions against temperature variation) and rigidity of the insulating substrate 3 can be improved, and the capacitor element embedded in the insulating substrate 3 can be protected effectively.

(5) The increased dimensional stability of the insulating substrate 3 enables the wiring patterns 7a and 7b and the second wiring patterns 105a and 105b to be formed on the insulating substrate 3 more accurately by the buildup process.

(6) The increased rigidity stability of the insulating substrate 3 enables fabrication of a large number of printed-wiring substrates 1 from a large substrate for multi-piece fabrication. As a result, the number of fabrication steps can be reduced, thus facilitating fabrication of the printed-wiring substrate and reducing fabrication cost further.

(7) Since resin charged into a mold permeates into glass fibers constituting glass cloth to thereby impregnate the glass cloth with the resin, the adhesion strength between the resin and the glass cloth increases. As a result, the printed-wiring substrate 1 has increased rigidity.

Next, a fourth embodiment will be described. In the fourth embodiment, layers of resin 4 and a metal plate (in the present embodiment, a Cu plate) 303 are stacked in the thickness direction in order to constitute the insulating substrate 3. Specifically, in the step that has been described with reference to FIG. 1(b) (i.e., the "first step"), charging of the resin 4 into a mold is divided into a plurality of charging operations (two operations in the fourth embodiment); and between subsequent operations of charging the resin 4, the metal plate 303 is disposed on the layer of the resin 4 formed in the mold. Thus is formed the insulating substrate 3, which includes layers of the resin 4 and the metal plate 303 alternately stacked in the thickness direction (see FIG. 4).

This step will be described in detail. First, a capacitor element 13 having a roughened surface is placed in an unillustrated mold for molding the insulating substrate 3. Into the mold, a predetermined amount (about ½ the amount necessary to mold the insulating substrate 3) of resin 4 is charged. The charging of the resin 4 is stopped temporarily, and a metal plate 303 is placed on the charged resin 4.

As in the case of the above-described glass cloth 203, the metal plate 303 has a size which is substantially the same as that of the insulating substrate 3 to be molded; and a through 303a having a cross section greater than that of the capacitor element 13 is formed in the metal plate 303 at a position corresponding to that of the capacitor element 13. The metal plate 303 is made of Cu. In order to prevent electrical contact between the metal plate 303 and the through-hole conductors 11, through holes 303b of larger cross section than the through hole 9 for the through-hole conductors 11 are formed in the metal plate 303 at positions corresponding to those of the through-hole conductors 11.

Figure 4:
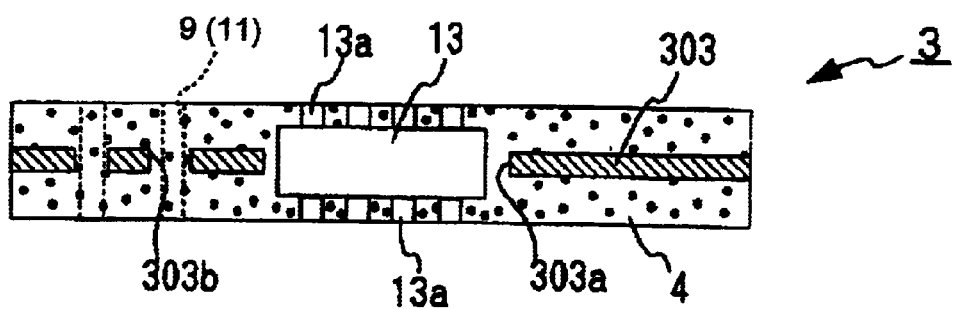
FIG. 4 is an explanatory view showing the structure of the printed-wiring substrate according to a fourth embodiment of the invention.

Subsequently, the resin 4 is charged in a predetermined amount, and is hardened to thereby obtain the insulating substrate 3, which includes layers of the resin 4 and the metal plate 303 alternately stacked in the thickness direction. Subsequently, the opposite surfaces the insulating substrate 3 are polished in order to flatten the opposite surfaces and expose the terminals 13a of the capacitor element 13 to the outside from the opposite surfaces of the insulating substrate 3, as shown in FIG. 4.

Since the structure and the fabrication steps of the printed-wiring substrate according to the fourth embodiment are the same as those of the second embodiment, repeated descriptions thereof are omitted.

In addition to the above-described effects (1) to (3), the printed-wiring substrate according to the fourth embodiment achieves the above-described effects (4) to (7), because the insulating substrate 3 is molded through alternate stacking of the resin 4 and the metal plate 303 in the thickness direction thereof. Moreover, the fourth embodiment achieves the following effect (8).

(8) Since the metal plate 303 is made of the same material as the metallic material (Cu) of the wiring patterns (the wiring patterns 7a and 7b and the second wiring patterns 105a and 105b), the overall spatial distribution of coefficient of thermal expansion of the printed-wiring substrate 1 is stabilized, so that the reliability of the printed-wiring substrate 1 is enhanced.

Figure 5A:
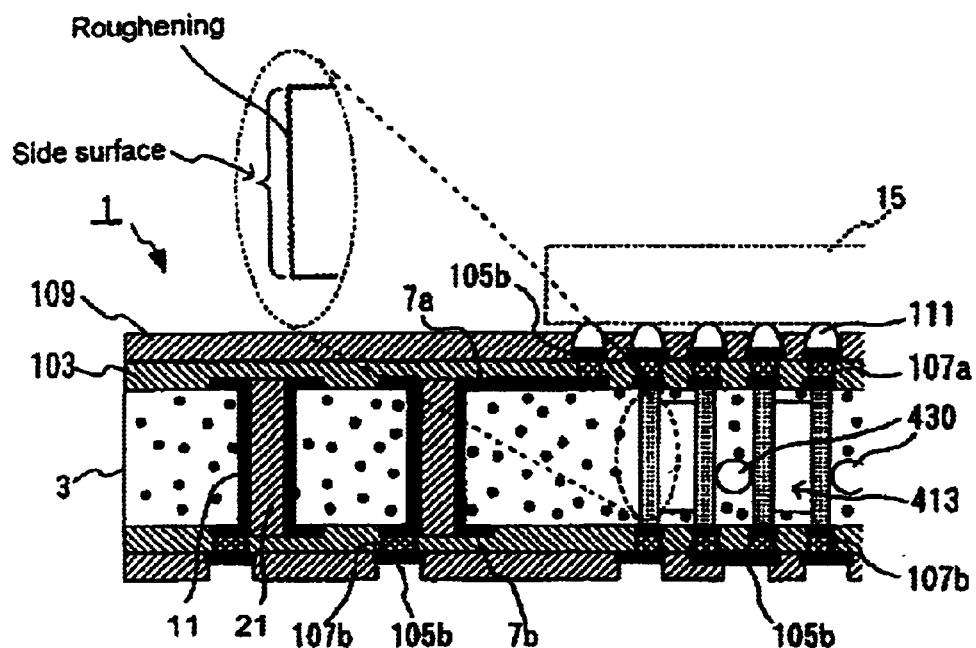
FIGS. 5(a) and 5(b) are explanatory views showing the structure of the printed-wiring substrate according to a fifth embodiment of the invention.
Figure 5B:
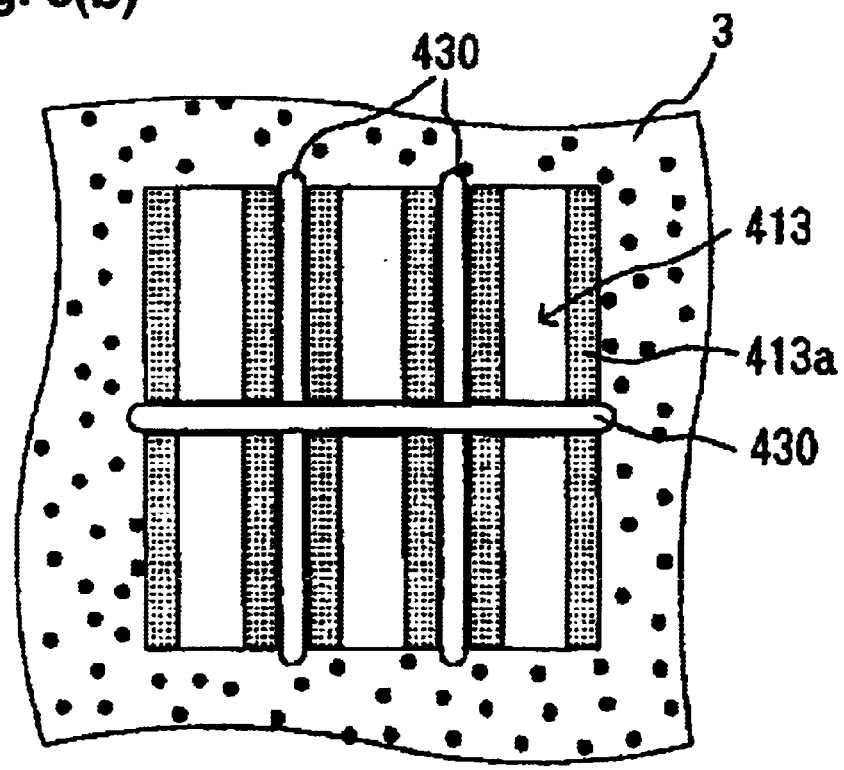

Next, a fifth embodiment of the present invention will be described. FIG. 5 shows the structure of a printed-wiring substrate 1 according to the fifth embodiment. FIG. 5(b) is a schematic diagram of an internal portion of an insulating substrate 3 in the vicinity of a capacitor element 413, as viewed from the side of IC chip 15 in FIG. 5(a).

In contrast with the first through fourth embodiments in which a single capacitor element 13 is embedded in the insulating substrate 3, in the printed-wiring substrate 1 of the present embodiment shown in FIG. 5, a large number of capacitor elements 413 are embedded in the insulating substrate 3. Moreover, a fiber 430 serving as a reinforcement member is disposed between adjacent capacitor elements 413. The fiber 430 is formed of an insulating material (in the present embodiment, nylon resin) and has a thickness substantially equal to the space between adjacent capacitor elements 413.

Such a configuration is realized through, for example, a process described below. First, a plurality of capacitor elements 413 are placed in a mold for molding the insulating substrate 3; and fibers 430 are disposed in spaces between the capacitor elements 413 such that half of the fibers 430 extend vertically and intersect with the remaining fibers 430 extending horizontally in FIG. 5(b). Subsequently, resin is charged into the mold and hardened to thereby obtain the insulating substrate 3, which includes the capacitor elements 413 and the fibers 430, as shown in FIG. 5. The fibers 430 may be placed in the mold before disposing of the capacitor elements 413 in the mold. This facilitates positioning of the capacitor elements 413 within the mold.

Since the configuration of the remaining portion is the same as that of the second embodiment, its repeated description is omitted. The printed-wiring substrate of the fifth embodiment having the above-described configuration achieves the following effects as well as the above-described effects (1) to (3).

(9) Since the fibers 430 are buried in the insulating substrate 3, the rigidity of the insulating substrate 3 can be increased. Therefore, the capacitor elements 413 embedded in the insulating substrate 3 can be protected effectively.

(10) Since the fibers 430 are located in the spaces between the capacitor elements 413, the possibility of the insulating substrate 3 being broken or cracking between the capacitor elements 413 can be reduced. Further, the fibers 430 can maintain clearance between the capacitor elements 413.

(11) The thickness of the fibers 430 each disposed between adjacent capacitor elements 413 is made equal to the distance between the adjacent capacitor elements 413. Therefore, aligning the capacitor elements 413 at desired intervals is easy. In other words, the positional relationship among the capacitor element 413 can be maintained reliably; and the clearance necessary for insulation can be maintained reliably between adjacent capacitor elements 413.

(12) Since the fibers 430 are arranged to extend along not only a first direction but also another direction intersecting the first direction, the insulating substrate 3 can be reinforced such that the insulating substrate 3 can endure forces from various directions.

(13) The fibers 430 are formed of nylon resin, which is an insulating material. Therefore, the fibers 430 do not form a short circuit, which is preferable.

The present invention has been described with reference to the above embodiments. However, the present invention is not limited to these embodiments and may be practiced in various modes.

For example, in the above-described embodiments, conductor layers (the wiring patterns 7a and 7b) are formed by means of a subtractive process (FIG. 1(e)). However, the manner of forming the conductor layers is not limited thereto, and the conductor layers may be formed by any other method, such as a semi-additive process or a full-additive process.

Further, in the above-described third and fourth embodiments, the glass cloth 203 or the metal plate 303 is embedded in the insulating substrate 3 as a reinforcing member. However, the manner of reinforcement is not limited thereto. For example, a ceramic plate may be embedded (i.e., layers of resin 4 and a ceramic plate are stacked alternately). When the wiring patterns 7a and 7b formed on the opposite surfaces of the insulating substrate 3 must be connected by means of through-holes conductors, vias are previously formed in the ceramic plate at positions corresponding to the through-holes conductors. The vias can be formed of tungsten or molybdenum through simultaneous firing together with the ceramic plate.

Moreover, when a plate is provided as a reinforcement member, needless to say, the material of the plate is not limited to metal or ceramic, and a glass plate or a resin plate may be employed.

In addition to a through hole (e.g., the through hole 303a of the metal plate 303) for accommodating the capacitor element, projections and depressions or through holes are preferably formed in the plate in order to increase the adhesion strength between the plate and the resin 4 constituting the insulating substrate 3. The provision of projections and depressions or through holes increases the contact area between the plate and the resin 4, so that the adhesion strength between the plate and the resin 4 can be increased. Alternatively, depending on the material of the plate, a primer (e.g., silane coupling agent) for surface preparation is applied to the surface of the plate in order to enhance the adhesion strength between the plate and the resin 4.

In the above-described fourth embodiment, a Cu plate is used as the metal plate 303. However, the metal plate is not limited thereto, and various other metal plates may be used. In this case, it is preferred that a selected metal plate have high rigidity and be formed of the same metal as that used for forming wiring patterns.

In the above-described first through fourth embodiments, as the second step for exposing the terminals 13a of the capacitor element 13 to the outside of the insulating substrate 3, a process of polishing the opposite surfaces of the insulating substrate 3 to thereby flatten the opposite surfaces of the insulating substrate 3 and expose the terminals 13a of the capacitor element 13 to the outside of the insulating substrate 3 is performed. However, the second step is not limited thereto; for example, openings may be formed in the insulating substrate 3 by means of laser machining to thereby expose the terminals 13a of the capacitor element 13 to the outside from (both surfaces or one surface) of the insulating substrate 3.

When the process of polishing the opposite surfaces of the insulating substrate 3 is performed as the second step for exposing the terminals 13a of the capacitor element 13 to the outside of the insulating substrate 3, flattening of the insulating substrate 3 can be performed simultaneously, which is preferable from the viewpoint of reducing the number of fabrication steps. On the other hand, when the process of forming openings in the insulating substrate 3 by means of laser machining is performed as the second step, the operation of exposing the terminals 13a of the capacitor element 13 becomes relatively easy even in the case in which the thickness of the capacitor element 13 is smaller than the thickness of the insulating substrate 3. That is, irrespective of the thickness of the insulating substrate 3, various capacitor elements 13 having different sizes and shapes can be employed, so that the degree of design freedom can be enhanced.

When a plurality of capacitor elements 413 are embedded in the insulating substrate 3 as in the case of the fifth embodiment, the heights (depths) of the individual capacitor elements 413 may become uneven, and the individual capacitor elements 413 may have different thicknesses. In such a case, simultaneously exposing the terminals 413a of all the capacitor elements 413 by means of polishing is difficult. However, employment of laser machining enables reliable formation of openings for exposing all the terminals 413a, even when the capacitor elements 413 vary in height (depth).

This application is based on Japanese Patent Application No. 2000-178491 filed Jun. 14, 2000, the disclosure of which is incorporated herein by reference in its entirety.

What is claimed is:

1. A printed-wiring substrate comprising:
   a molded insulating substrate serving as a support;
   a conductor layer formed on the insulating substrate; and
   a capacitor element embedded in the insulating substrate and connected to the conductor layer, wherein
   the printed-wiring substrate is adapted for mounting an integrated-circuit element thereon connecting to the conductor layer, characterized in that
   the insulating substrate is molded by placing the capacitor element in a predetermined mold and charging resin into the mold, and
   the capacitor element has roughened side surfaces to increase the adhesion strength between the capacitor element and resin charged into the mold.

2. The printed-wiring substrate according to claim 1, wherein the insulating substrate includes a reinforcement member embedded in the insulating substrate.

3. The printed-wiring substrate according to claim 1, wherein the insulating substrate has through holes and through-hole conductors formed on wall surfaces of the through holes.

4. The printed-wiring substrate according to claim 1, wherein the capacitor element has terminals on each of upper and lower surfaces thereof; and the terminals on the upper surface are exposed from an upper surface of the insulating substrate, and the terminals on the lower surface are exposed from a lower surface of the insulating substrate.

5. The printed-wiring substrate according to claim 2, wherein the insulating substrate includes, as the reinforcement member, glass cloth embedded in the insulating substrate.

6. The printed-wiring substrate according to claim 4, further comprising at least one insulating layer formed on each of the upper and lower surfaces of the insulating substrate and at least one conductor layer formed on the insulating layer, wherein the conductor layer is connected to the terminals of the capacitor element or the through-hole conductors by vias formed in the insulating layer.

7. The printed-wiring substrate according to claim 2, wherein the insulating substrate includes, as the reinforcement member, a metal plate embedded in the insulating substrate.

8. A method for fabricating a printed-wiring substrate including an insulating substrate formed of resin and serving as a support, a conductor layer formed on the insulating substrate, and a capacitor element connected to the conductor layer comprising:

a molded insulating substrate serving as a support;

a conductor layer formed on the insulating substrate; and a capacitor element embedded in the insulating substrate and connected to the conductor layer, wherein the printed-wiring substrate is adapted for mounting an integrated-circuit element thereon connecting to the conductor layer, characterized in that the insulating substrate is molded by placing the capacitor element in a predetermined mold and charging resin into the mold, and the capacitor element has roughened side surfaces to increase the adhesion strength between the capacitor element and resin charged into the mold, the method comprising:

roughening at least side surfaces of the capacitor element;

placing the capacitor element having roughened side surfaces in a mold and charging resin into the mold to thereby mold the insulating substrate;

exposing terminals of the capacitor element to the outside of the insulating substrate; and forming a conductor layer on the insulating substrate such that the conductor layer is connected to the terminals of the capacitor element exposed to the outside of the insulating substrate.

9. The method for fabricating a printed-wiring substrate according to claim 8, wherein said charging comprises a plurality of charging operations, and between subsequent charging operations, disposing a sheet of glass cloth on a resin layer formed within the mold to form layers of the resin and the layer of glass cloth alternately stacked in the thickness direction.

10. The method for fabricating a printed-wiring substrate according to claim 8, wherein said charging comprises a plurality of charging operations, and between subsequent charging operations, disposing a metal plate on a resin layer formed within the mold to form layers of the resin and the metal plate alternately stacked in the thickness direction.

* * * * *